United States Patent
Kandregula

(10) Patent No.: US 9,766,302 B2
(45) Date of Patent: Sep. 19, 2017

(54) METHODS AND APPARATUS FOR CALIBRATING SENSORS UNDER DISRUPTIVE CONDITIONS

(71) Applicant: Samsung Electronics Co., Ltd., Suwon-si, Gyeonggi-do (KR)

(72) Inventor: Naga R. Kandregula, Cupertino, CA (US)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 366 days.

(21) Appl. No.: 14/555,195

(22) Filed: Nov. 26, 2014

(65) Prior Publication Data
US 2016/0149655 A1    May 26, 2016

(51) Int. Cl.
*H04W 4/00* (2009.01)
*G01R 33/00* (2006.01)

(52) U.S. Cl.
CPC ................................ *G01R 33/0035* (2013.01)

(58) Field of Classification Search
CPC ................................ H04B 17/11; H04B 17/21
USPC .................. 455/423, 67.11, 115.1, 226.1
See application file for complete search history.

(56) References Cited

U.S. PATENT DOCUMENTS

| | | | | |
|---|---|---|---|---|
| 2011/0177848 | A1* | 7/2011 | Tanabe | G01C 22/006 455/575.1 |
| 2011/0224581 | A1* | 9/2011 | Cinti | A61D 17/006 600/588 |
| 2014/0135040 | A1* | 5/2014 | Edge | H04W 4/028 455/456.6 |
| 2015/0011169 | A1* | 1/2015 | Kates | G01N 33/0065 455/73 |
| 2015/0289111 | A1* | 10/2015 | Ozkan | H04W 4/04 455/456.1 |
| 2015/0371518 | A1* | 12/2015 | Mittal | G08B 21/182 340/539.11 |
| 2016/0037482 | A1* | 2/2016 | Higgins | H04W 68/005 455/414.1 |

* cited by examiner

*Primary Examiner* — Wen Huang

(57) ABSTRACT

A method and apparatus are provided for calibrating a sensor under disruptive conditions. The apparatus includes user equipment. The user equipment includes a memory element and processing circuitry coupled to the memory element. The processing circuitry monitors at least one sensor of the user equipment. The at least one sensor includes an existing calibration. The processing circuitry also identifies a disruption in a sensor of the at least one sensor, the disruption causing unexpected sensor readings for the sensor based on the existing calibration. The processing circuitry also calculates a new calibration based on the disruption.

17 Claims, 6 Drawing Sheets

METHODS AND APPARATUS FOR CALIBRATING SENSORS UNDER DISRUPTIVE CONDITIONS

TECHNICAL FIELD

The present application relates generally to sensors and, more specifically, to calibrating sensor devices under disruptive conditions.

BACKGROUND

Peripheral sensor devices are becoming more common in the mobile market. Specifically, wearable technologies that can calculate steps and activity are able to be paired with user equipment (UE) and report health information to a user. These wearable technologies are costly due to the sensors, transmission capabilities, size, batteries, among other reasons. Additionally, the wearable technologies must be charged periodically and sometimes a user may not have charged the device before an activity.

SUMMARY

An apparatus is provided for calibrating a sensor under disruptive conditions. The apparatus includes user equipment. The user equipment includes a memory element and processing circuitry coupled to the memory element. The processing circuitry monitors at least one sensor of the user equipment. The at least one sensor includes an existing calibration. The processing circuitry also identifies a disruption in a sensor of the at least one sensor, the disruption causing unexpected sensor readings for the sensor based on the existing calibration. The processing circuitry also calculates a new calibration based on the disruption.

A method is provided for calibrating a sensor. The method includes monitoring at least one sensor of the user equipment. The at least one sensor includes an existing calibration. The method also includes identifying a disruption in the sensor of the at least one sensor, the disruption causing unexpected sensor readings for the sensor based on the existing calibration. The method also includes calculating a new calibration based on the disruption.

A non-transitory computer-readable storage medium comprising logic, stored on the computer-readable storage medium for execution on a plurality of processors, is provided for calibrating a sensor. The logic provides for monitoring at least one sensor of the user equipment. The at least one sensor includes an existing calibration. The logic also provides for identifying a disruption in the sensor of the at least one sensor, the disruption causing unexpected sensor readings for the sensor based on the existing calibration. The logic also provides for calculating a new calibration based on the disruption.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 6, discussed below, and the various embodiments used to describe the principles of the present invention in this patent document are by way of illustration only and should not be construed in any way to limit the scope of the disclosure. Those skilled in the art will understand that the principles of this disclosure may be implemented in any suitably arranged device or system.

Figure 1:
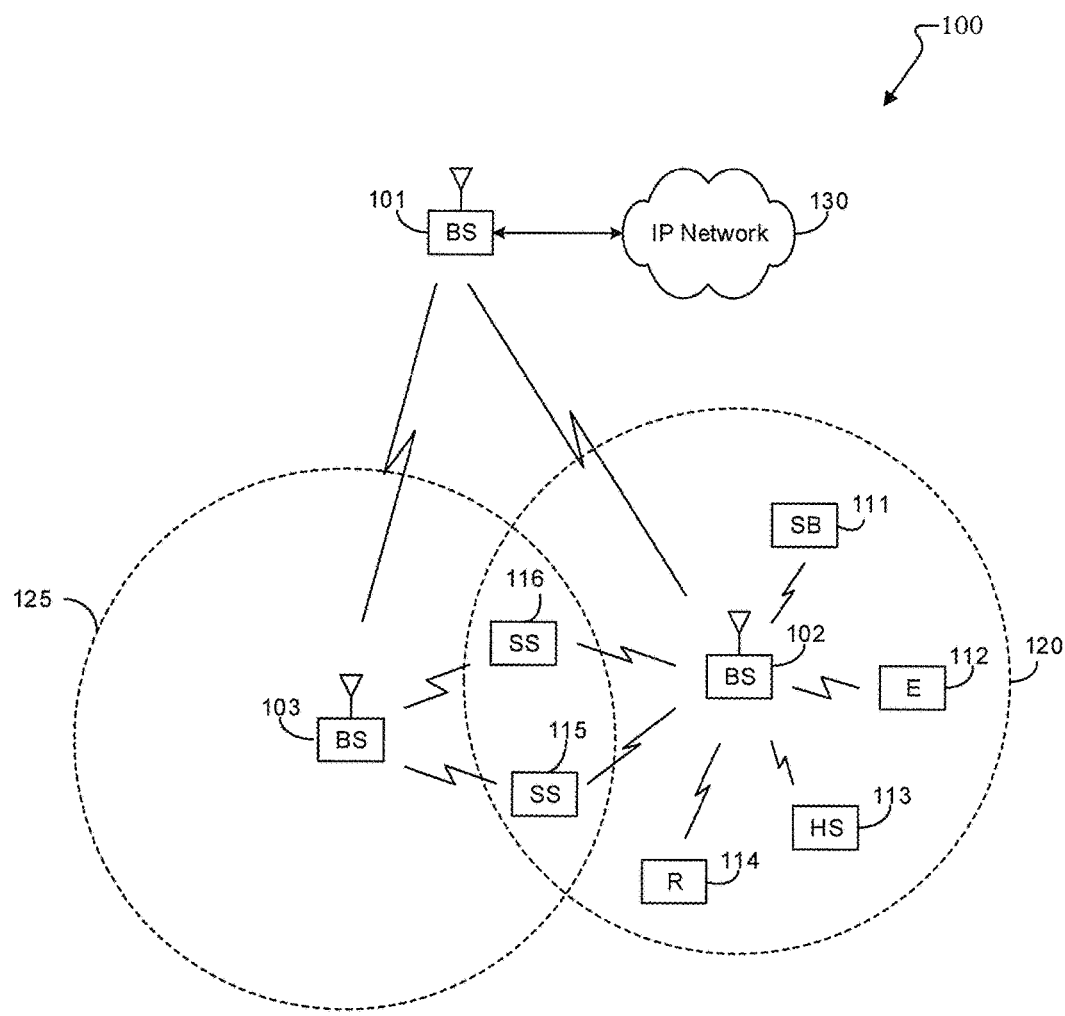
FIG. 1 illustrates an example wireless network according to this disclosure.

FIG. 1 illustrates an example wireless network 100 according to this disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes an eNodeB (eNB) 101, an eNB 102, and an eNB 103. The eNB 101 communicates with the eNB 102 and the eNB 103. The eNB 101 also communicates with at least one Internet Protocol (IP) network 130, such as the Internet, a proprietary IP network, or other data network.

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M) like a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, LTE-A, WiMAX, WiFi, or other wireless communication techniques.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNB 101, 102, and/or 103 could provide access to other or additional external networks, such as external telephone networks or other types of data networks.

Figure 2:
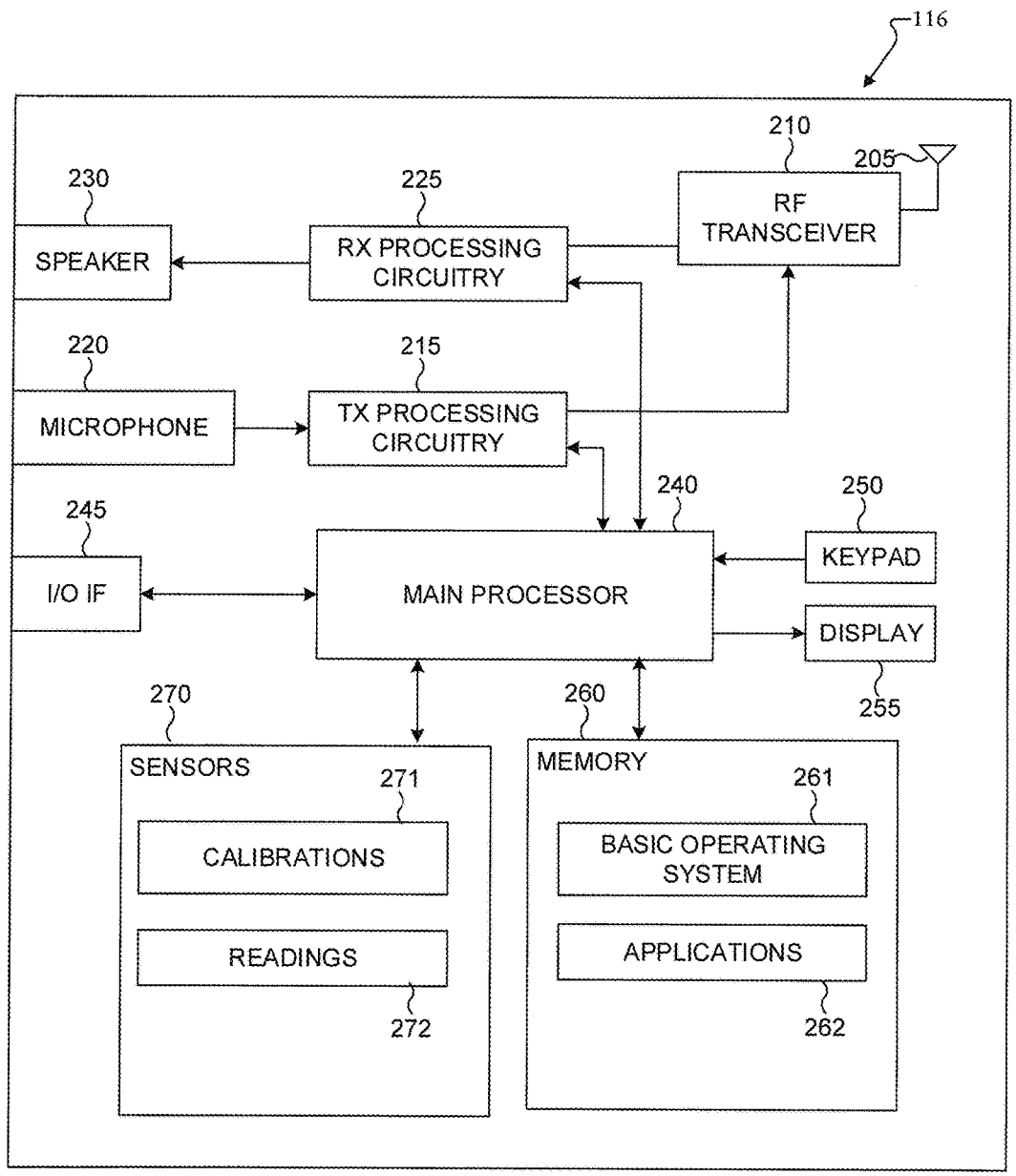
FIG. 2 illustrates an example UE according to this disclosure.

FIG. 2 illustrates an example UE 116 according to this disclosure. The embodiment of the UE 116 illustrated in FIG. 2 is for illustration only, and the UEs 111-115 of FIG. 1 could have the same or similar configuration. However, UEs come in a wide variety of configurations, and FIG. 2 does not limit the scope of this disclosure to any particular implementation of a UE.

As shown in FIG. 2, the UE 116 includes an antenna 205, a radio frequency (RF) transceiver 210, transmit (TX) processing circuitry 215, a microphone 220, and receive (RX) processing circuitry 225. The UE 116 also includes a speaker 230, a main processor 240, an input/output (I/O) interface (IF) 245, a keypad 250, a display 255, and a memory 260. The memory 260 includes a basic operating system (OS) program 261 and one or more applications 262.

The RF transceiver 210 receives, from the antenna 205, an incoming RF signal transmitted by an eNB of the network 100. The RF transceiver 210 down-converts the incoming RF signal to generate an intermediate frequency (IF) or baseband signal. The IF or baseband signal is sent to the RX processing circuitry 225, which generates a processed baseband signal by filtering, decoding, and/or digitizing the baseband or IF signal. The RX processing circuitry 225 transmits the processed baseband signal to the speaker 230 (such as for voice data) or to the main processor 240 for further processing (such as for web browsing data).

The TX processing circuitry 215 receives analog or digital voice data from the microphone 220 or other outgoing baseband data (such as web data, e-mail, or interactive video game data) from the main processor 240. The TX processing circuitry 215 encodes, multiplexes, and/or digitizes the outgoing baseband data to generate a processed baseband or IF signal. The RF transceiver 210 receives the outgoing processed baseband or IF signal from the TX processing circuitry 215 and up-converts the baseband or IF signal to an RF signal that is transmitted via the antenna 205.

The main processor 240 can include one or more processors or other processing devices and execute the basic OS program 261 stored in the memory 260 in order to control the overall operation of the UE 116. For example, the main processor 240 could control the reception of forward channel signals and the transmission of reverse channel signals by the RF transceiver 210, the RX processing circuitry 225, and the TX processing circuitry 215 in accordance with well-known principles. In some embodiments, the main processor 240 includes at least one microprocessor or microcontroller.

The main processor 240 is also capable of executing other processes and programs resident in the memory 260. The main processor 240 can move data into or out of the memory 260 as required by an executing process. In some embodiments, the main processor 240 is configured to execute the applications 262 based on the OS program 261 or in response to signals received from eNBs or an operator. The main processor 240 is also coupled to the I/O interface 245, which provides the UE 116 with the ability to connect to other devices such as laptop computers and handheld computers. The I/O interface 245 is the communication path between these accessories and the main processor 240.

The main processor 240 is also coupled to the keypad 250 and the display unit 255. The operator of the UE 116 can use the keypad 250 to enter data into the UE 116. The display 255 may be a liquid crystal display or other display capable of rendering text and/or at least limited graphics, such as from web sites.

The memory 260 is coupled to the main processor 240. Part of the memory 260 could include a random access memory (RAM), and another part of the memory 260 could include a Flash memory or other read-only memory (ROM).

The sensors 270 are also coupled to the main processor 240. The sensors 270 can detect events or changes in quantities and provide a corresponding output. For example, sensors 270 can include gyroscope, accelerometer, proximity sensor, ambient light sensor, magnetometer, location sensors, and the like. In some embodiments, the sensors 270 are configured with calibrations 271. The calibrations 271 allow for a baseline to measure changes against and can be adjusted. The sensors 270 can also obtain readings 272. The readings can be changes between a measurement and the baseline calibration. The readings 272 can be stored in memory 260 as well as other storage devices.

Although FIG. 2 illustrates one example of UE 116, various changes may be made to FIG. 2. For example, various components in FIG. 2 could be combined, further subdivided, or omitted and additional components could be added according to particular needs. As a particular example, the main processor 240 could be divided into multiple processors, such as one or more central processing units (CPUs) and one or more graphics processing units (GPUs). Also, while FIG. 2 illustrates the UE 116 configured as a mobile telephone or smartphone, UEs could be configured to operate as other types of mobile or stationary devices.

One or more embodiments of this disclosure provide establishing a base line value for a sensor, such as magnetometer, under induced adverse conditions and detecting movement of a UE sensor in and out of field of negative influence caused by induced condition In an example embodiment, a magnetometer on a UE is used to detect the proximity of a normal magnet. In another example embodiment, the UE uses this data to count and report an action and/or action, such as, for example, but not limited to, push-ups, sit-ups, pull-ups, lap running, running, walking, jumping, swimming, and the like.

In one example, a UE calibrates a sensor to establish a baseline measurement under disruptive conditions. Disruptive conditions can be when the sensors are having unexpected readings. Next, a user brings a normal magnet and performs configuration activity such as establishing one or more disruption values to store for reference. The disruption values may be referred to as threshold configuration values. The disruption values can be a range of values.

Next, the user can wear the magnet and UE. The user places the magnet and UE in appropriate places based on activity (which can be identified for establishing the disruption values). For example, for sit-ups, a magnet can be placed on the floor near the left leg and a UE in pocket of shorts of a user.

Next, the user can perform the activity, such as the sit-up. As the user performs the activity, the UE and magnet move nearer and further and the sensor has readings similar to the disruption values (or threshold values). The UE can keep track of a count of the repetitions of the disruption values being reached.

Figure 3:
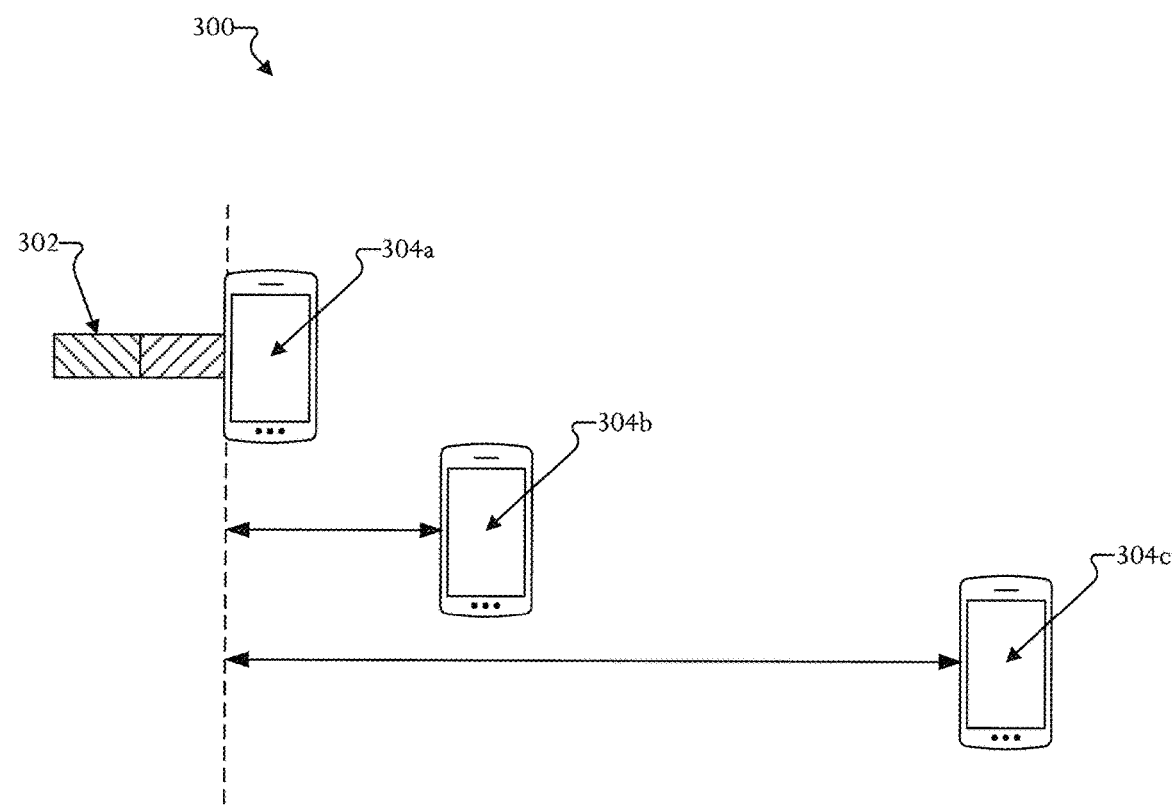
FIG. 3 illustrates calibration system with user equipment performing sensor calibration in accordance with embodiments of this disclosure.

FIG. 3 illustrates calibration system 300 with user equipment performing sensor calibration in accordance with embodiments of this disclosure. The embodiment of the calibration system 300 illustrated in FIG. 3 is for illustration only. However, calibration systems come in a wide variety of configurations, and FIG. 3 does not limit the scope of this disclosure to any particular implementation of a calibration system.

Calibration system 300 comprises a disruption device 302 and user equipment (UE) 304. In an example embodiment, disruption device 302 may be any type of device that affects the readings of sensors of UE 304. For example, disruption device 302 may be a magnet, metal, device producing an electric or magnetic field, and the like. Under scenarios where the disruption device 302 is not present, the sensors of UE 304 may read normal readings. For example, a magnetometer may read variations in measuring the Earth's magnetic field. A disruption device 302 in this example could be a magnet. The magnet could cause the magnetometer to have readings different from previous operating conditions.

In an example embodiment, calibration system 300 shows UE 304a nearest to disruption device 302 causing a maximum level of disruption to the readings of the sensor of UE 304a. UE 304b is at an intermediate range from disruption device 302 causing a moderate level of disruption to the readings of the sensor of UE 304b. UE 304c can be at the furthest range while still having a reading of disruption.

In an example embodiment, UE 304 can use the minimum and maximum readings to calibrate the sensors of UE 304 with the disruption device 302. Additionally, the UE 304 can set specific disruption values for later reference. For example, the sensor value of UE 304b can be set as a disruption value. This disruption value can later be compared to a current sensor value of the UE 304.

Figure 4:
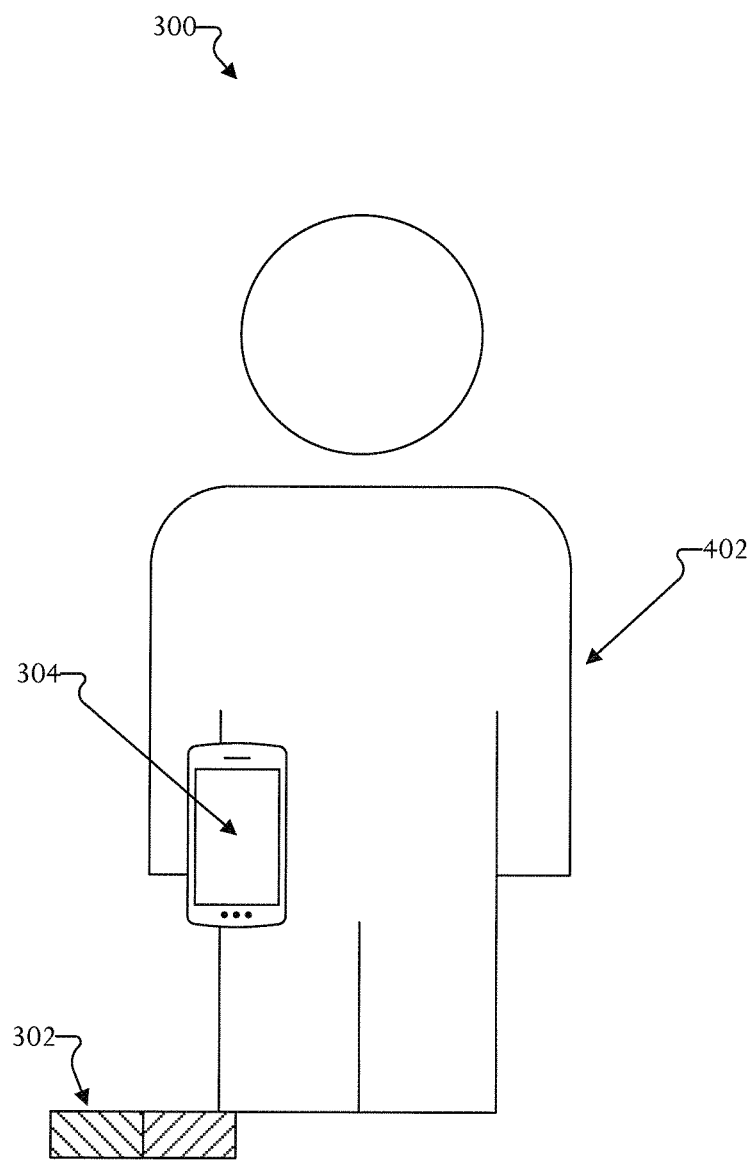
FIG. 4 illustrates an activity setup with user equipment and a disruption device setting disruption values in accordance with embodiments of this disclosure.

FIG. 4 illustrates an activity setup 400 with user equipment and a disruption device setting disruption values in accordance with embodiments of this disclosure. The embodiment of the activity setup 400 illustrated in FIG. 4 is for illustration only. However, activity setups come in a wide variety of configurations, and FIG. 4 does not limit the scope of this disclosure to any particular implementation of an activity setup.

Activity setup 400 comprises a user 402, disruption device 302, and user equipment (UE) 304. During activity setup 400, user 402 can wear or attach UE 304 at any position or location. User 402 can set a first disruption level at one position. For example, if there are two desirable positions and disruption levels, and those levels are "sit" and "stand", then user 402 can set a first disruption level while standing. User 402 can set a second disruption level while sitting. In an example embodiment, there can be a difference in sensor readings, between the two positions, as they relate to disruption device 302. For example, a sitting position may result in a greater value of disruption while a standing position may result in a lesser value.

In another example embodiment, UE 304 can indicate or inform user 402 of a specific position to place UE 304 and disruption device 302. Additionally, the UE 304 can indicate the positions of user 402 as well.

Figure 5:
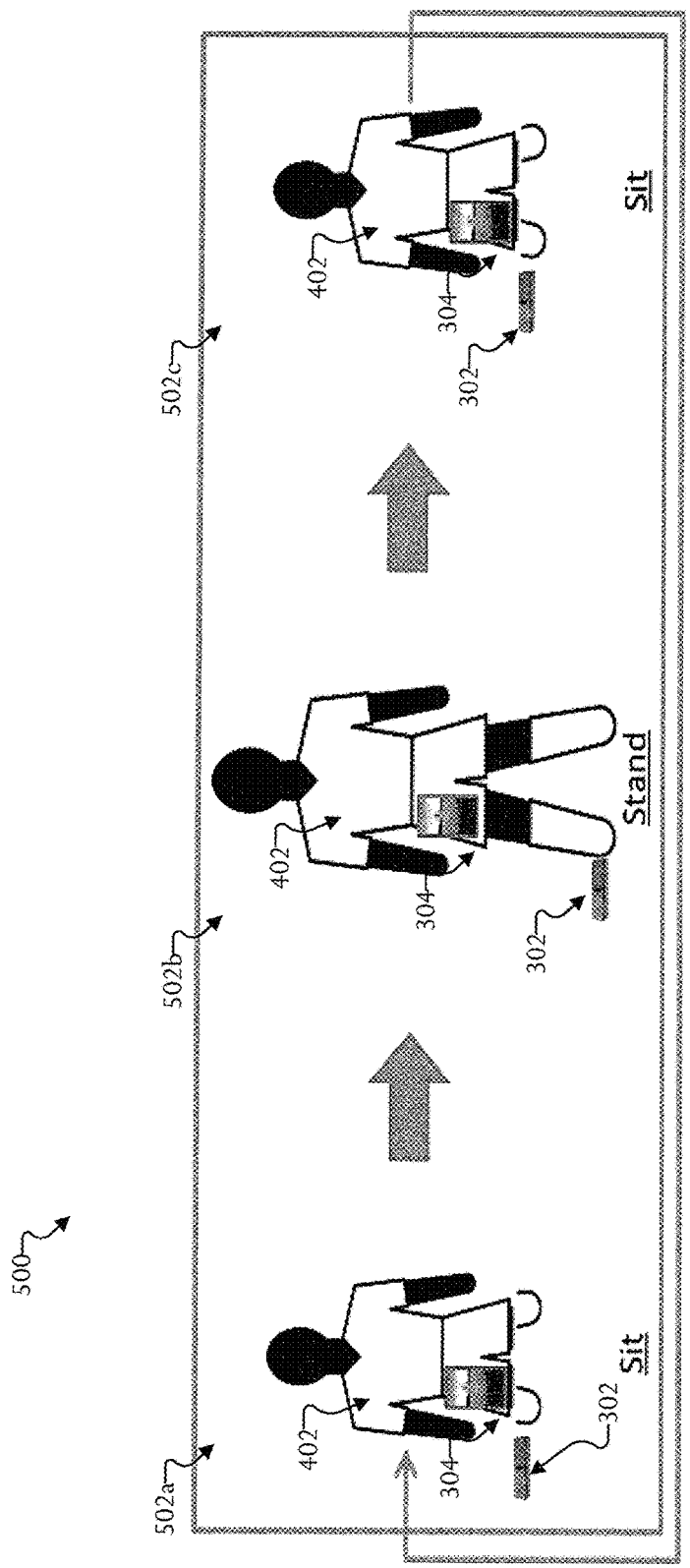
FIG. 5 illustrates an activity with user equipment and a disruption device in accordance with embodiments of this disclosure.

FIG. 5 illustrates an activity 500 with user equipment and a disruption device in accordance with embodiments of this disclosure. The embodiment of the activity 500 illustrated in FIG. 5 is for illustration only. However, activities come in a wide variety of configurations, and FIG. 5 does not limit the scope of this disclosure to any particular implementation of an activity.

In an embodiment, activity 500 comprises a user 402, disruption device 302, and user equipment (UE) 304. In one example, for activity 500, user 402 can "sit" and "stand". User 402 can perform this activity multiple times. For each position 502, the sensors of UE 304 may have readings that fall within a disruption value range. When the readings fall within the disruption value, the UE 304 can count that instance.

Figure 6:
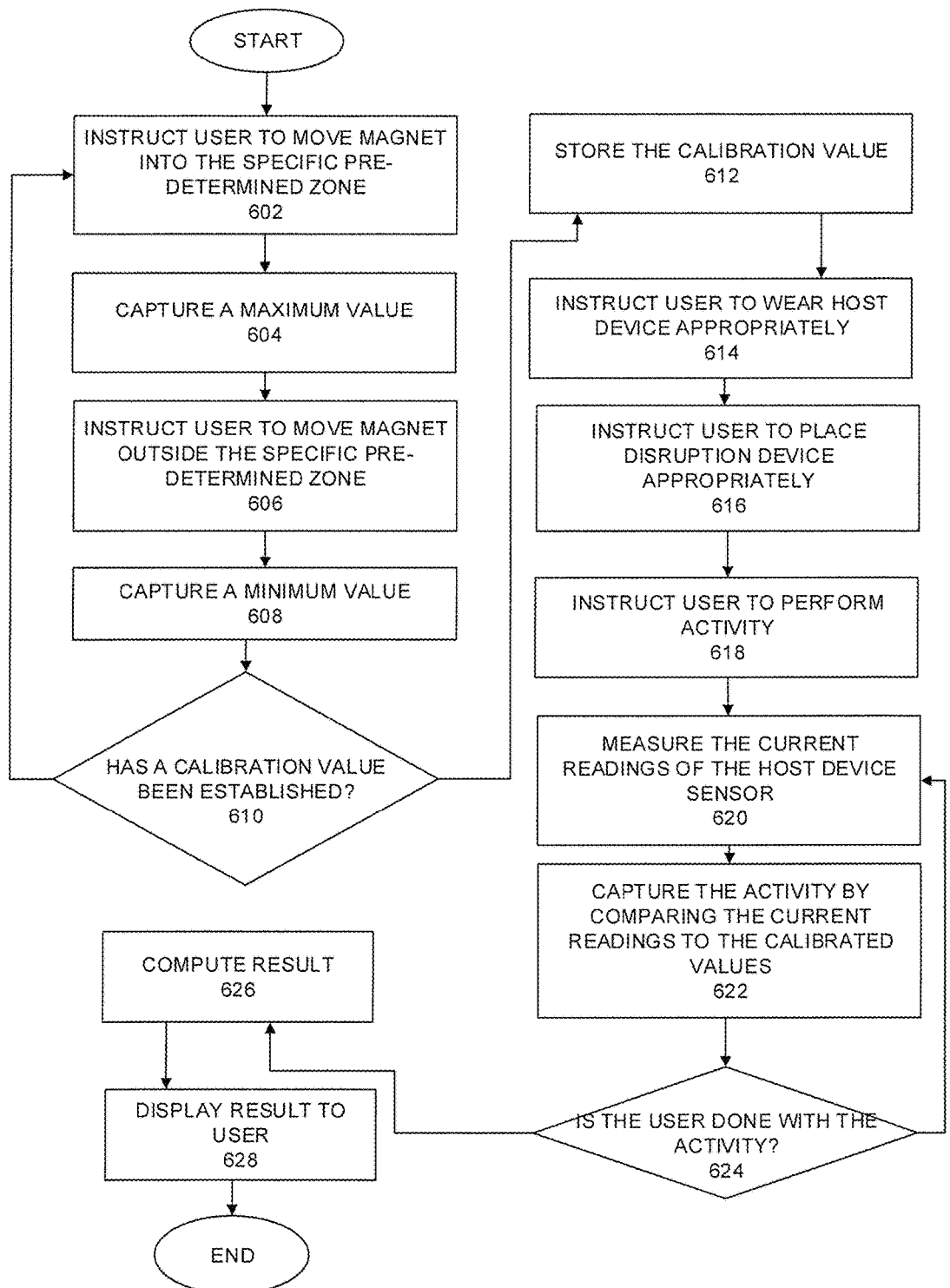
FIG. 6 illustrates a process for managing sensor readings in accordance with an embodiment of this disclosure.

FIG. 6 illustrates a process 600 for managing sensor readings in accordance with an embodiment of this disclosure. The controller here may represent the main processor 240 and the memory element may be the memory 260 in FIG. 2. The embodiment of the process 600 shown in FIG. 6 is for illustration only. Other embodiments of the process 600 could be used without departing from the scope of this disclosure.

At operation 602, a controller instructs a user to move a magnet into a specified pre-determined zone. The magnet is an example of a disruption device. The pre-determined zone may be specific for the type of activity that the user it going to perform.

At operation 604, the controller controls the sensors to capture a maximum value. The maximum value can be the maximum value of the disruption in the readings caused by the disruption device, such as the magnet. The maximum value can be the value when the magnet is nearest to the UE. In another example, the maximum value can be a value of a specific distance between the disruption device and the UE.

At operation 606, a controller instructs a user to move a magnet outside a specified pre-determined zone. At operation 608, the controller controls the sensors to capture a minimum value. The minimum value can be the minimum value of the disruption in the readings caused by the disruption device, such as the magnet. The minimum value can be the value when the magnet is furthest from the UE. In another example, the minimum value can be a value of a specific distance between the disruption device and the UE.

At operation 610, the controller determines whether a calibration value has been established. The calibration value can be a table of values that correlates to a distance from the UE and strength of the disruption in the sensor readings. If the calibration value has not been established, the process 600 moves to operation 602. If the calibration value has been established, the controller, at operation 612, stores the calibration value. The calibration value can be stored in memory or other types of storage.

At operation 614, the controller controls a display and/or audio device to instruct the user to wear the host device appropriately. The host device may be a UE or other type of device with sensors. The term "appropriately" can be defined as a specific location. For example, the controller can instruct the user to wear the host device in a pocket, on the ground, on a belt, and the like. For example, if the use is going to perform sit-ups, then the magnet can be placed on the ground while the UE is place on an arm or chest, or vice versa. At operation 616, the controller controls a display and/or audio device to instruct the user to place the disruption device appropriately.

At operation 618, the controller controls a display and/or audio device to instruct the user to perform the activity. At operation 620, the controller measures the current readings of the sensors of the host device. At operation 622, the controller captures the activity by comparing the current readings to the calibrated values. At operation 624, the controller determines whether the user is done with the activity. The user may input into the device that the user is finished, the controller may ask the user whether the user is finished, and/or a period of time may elapse that indicates that the user is finished. If the user is not finished, the process 600 moves to operation 620. If the user is finished, the controller, at operation 626, computes a result of the activity. The result of the activity may be a count of repetitions and/or a summary of all activities. At operation 628, the controller controls a display to display the results.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A user equipment, the user equipment comprising:
a memory element; and
processing circuitry coupled to the memory element, the processing circuitry configured to:
 monitor at least one sensor of the user equipment, the at least one sensor comprising an existing calibration;
 identify a disruption in a sensor of the at least one sensor, the disruption causing unexpected sensor readings for the sensor based on the existing calibration;
 calculate a new calibration based on the disruption;
 control a display to instruct a user to position the user equipment in a first position and a disruption device in a second position, the first position and the second position causing a first disruption value; and
 control the display to instruct the user to position the user equipment in a third position, the third position and the second position causing a second disruption value.

2. The user equipment of claim 1, wherein the processing circuitry configured to identify the disruption in the sensor further comprises the processing circuitry configured to:
identify a max value of the disruption; and
identify a minimum value of the disruption.

3. The user equipment of claim 1, wherein the processing circuitry is further configured to:
set the first disruption value between the user equipment and the disruption;
set the second disruption value between the user equipment and the disruption; and
count a number of times a disruption value moves between the first disruption value to the second disruption value.

4. The user equipment of claim 3, wherein the processing circuitry is further configured to:
control the user equipment to report the number to the user.

5. The user equipment of claim 1, wherein the disruption is caused by the disruption device disposed on an external object separate from a user of the user equipment.

6. The user equipment of claim 5, wherein the disruption device is a magnet.

7. A method for calibrating a sensor, the method comprising:
monitoring at least one sensor of the user equipment, the at least one sensor comprising an existing calibration;
identifying a disruption in the sensor of the at least one sensor, the disruption causing unexpected sensor readings for the sensor based on the existing calibration;
calculating a new calibration based on the disruption;
controlling a display to instruct a user to position the user equipment in a first position and a disruption device in a second position, the first position and the second position causing a first disruption value; and
controlling the display to instruct the user to position the user equipment in third position, the third position and the second position causing a second disruption value.

8. The method of claim 7, wherein identifying the disruption in the sensor further comprises:
identifying a max value of the disruption; and
identifying a minimum value of the disruption.

9. The method of claim 7, further comprising:
setting the first disruption value between the user equipment and the disruption;
setting the second disruption value between the user equipment and the disruption; and
counting a number of times a disruption value moves between the first disruption value to the second disruption value.

10. The method of claim 9, further comprising:
controlling the user equipment to report the number to the user.

11. The method of claim 7, wherein the disruption is caused by the disruption device disposed on an external object separate from a user of the user equipment.

12. The method of claim 11, wherein the disruption device is a magnet.

13. A non-transitory computer-readable storage medium comprising logic, stored on the computer-readable storage medium for execution on a plurality of processors, for:
monitoring at least one sensor of the user equipment, the at least one sensor comprising an existing calibration;

identifying a disruption in the sensor of the at least one sensor, the disruption causing unexpected sensor readings for the sensor based on the existing calibration;

calculating a new calibration based on the disruption;

controlling a display to instruct a user to position the user equipment in a first position and a disruption device in a second position, the first position and the second position causing the first disruption value; and controlling the display to instruct the user to position the user equipment in third position, the third position and the second position causing the second disruption value.

14. The non-transitory computer-readable storage medium of claim 13, wherein identifying the disruption in the sensor further comprises:

identifying a max value of the disruption; and identifying a minimum value of the disruption.

15. The non-transitory computer-readable storage medium of claim 13, further comprising:

setting the first disruption value between the user equipment and the disruption;

setting the second disruption value between the user equipment and the disruption; and counting a number of times a disruption value moves between the first disruption value to the second disruption value.

16. The non-transitory computer-readable storage medium of claim 15, further comprising:

controlling the user equipment to report the number to the user.

17. The non-transitory computer-readable storage medium of claim 13, wherein the disruption is caused by the disruption device disposed on an external object separate from a user of the user equipment.

* * * * *